(12) United States Patent
Lambkin et al.

(10) Patent No.: US 7,151,282 B2
(45) Date of Patent: Dec. 19, 2006

(54) LIGHT EMITTING DIODE

(75) Inventors: John Douglas Lambkin, County Cork (IE); Thomas David McCormack, Cork (IE)

(73) Assignee: Firecomms Limited, Cork (IE)

( * ) Notice: Subject to any disclaimer, the term of this patent is extended or adjusted under 35 U.S.C. 154(b) by 0 days.

(21) Appl. No.: 11/044,163

(22) Filed: Jan. 28, 2005

(65) Prior Publication Data

US 2005/0127352 A1    Jun. 16, 2005

Related U.S. Application Data

(63) Continuation of application No. PCT/IE03/000108, filed on Jul. 31, 2003.

(30) Foreign Application Priority Data

Jul. 31, 2002 (IE) .................................. 2002/0644

(51) Int. Cl.
*H01L 33/00* (2006.01)
(52) U.S. Cl. .................... 257/79; 257/14; 257/E33.069
(58) Field of Classification Search ................... 257/13, 257/14, 96, 98, 101, 102, 103, 79, E33.033, 257/E33.034, E33.069
See application file for complete search history.

(56) References Cited

U.S. PATENT DOCUMENTS

| 5,466,950 | A |  | 11/1995 | Sugawara et al. ............ 257/94 |
| 5,925,896 | A |  | 7/1999 | Dutta ............................ 257/79 |
| 6,107,644 | A | * | 8/2000 | Shakuda et al. .............. 257/79 |
| 6,515,308 | B1 | * | 2/2003 | Kneissl et al. ................ 257/86 |
| 6,649,440 | B1 | * | 11/2003 | Krames et al. ............... 438/47 |
| 6,815,730 | B1 | * | 11/2004 | Yamada ....................... 257/101 |
| 6,867,426 | B1 | * | 3/2005 | Hsieh et al. ................... 257/12 |

FOREIGN PATENT DOCUMENTS

| EP | 0551001 A1 | 7/1993 |
| GB | 2352560 A | 1/2001 |
| WO | WO99/00851 | 1/1999 |
| WO | WO99/31738 | 6/1999 |
| WO | WO01/80322 | 10/2001 |

OTHER PUBLICATIONS

Shaw et al, Phys Stat Sol 192, No. 1, pp. 103-109, 2002, Modelling of Extraction Efficiency of GaN-Based Resonant . . . .
Calle et al, Phys Stat Sol 192, No. 2, pp. 277-285, 2002, Nitride RCLEDs Grown by MBE for POF Applications.
Nakada et al, Appl Phys Ltrs, vol. 76, No. 14, Apr. 3, 2000, pp. 1804-1806, Improved characteristics of InGaN multiple-quantum-well . . . .

* cited by examiner

*Primary Examiner*—Minhloan Tran
*Assistant Examiner*—Benjamin Tzu-Hung Liu
(74) *Attorney, Agent, or Firm*—Jacobson Holman PLLC

(57) ABSTRACT

A green LED has a substrate, a GaN heavily n-doped bottom confining layer, an active region, an upper GaN confinement layer, and a semi-transparent ohmic contact layer. The active region has less than or equal to three highly compressively strained quantum wells. The widths of the quantum wells is less than 3 nm. The active region arrangement provides a short free carrier life-time and hence an increase in the modulation bandwidth of the LED.

20 Claims, 5 Drawing Sheets

LIGHT EMITTING DIODE

This is a continuation of PCT/IE03/000108 filed Jul. 31, 2003 and published in English.

FIELD OF THE INVENTION

The invention relates to light emitting diodes for optical communication.

PRIOR ART DISCUSSION

Plastic optical fibre (POF) has been used for many years for relatively low data rate communication applications, particularly in industrial automation applications. In this instance the use of POF enables low cost optical fibre links to be established in high electromagnetic interference (EMI) environments without resorting to more costly glass fibre links. The large core of step-index plastic optical fibre (SI-POF) and the ability to use low cost plastic-moulded connectors gives a significant cost advantage when compared to glass fibre alternatives.

Due to the chemical nature of the atomic bonds of polymethylmethacrylate (PMMA), the polymer used to fabricate SI-POF, one of several attenuation windows in the POF occurs at 650 nm with an attenuation of approximately −180 dB/km. As efficient light emitting devices with an output wavelength to match the 650 nm window can be realised using the III–V compound semiconductor AlGaInP grown on GaAs substrates, 650 nm has become the de facto wavelength standard for POF links. Using low cost light emitting diodes (LEDs) operating at 650 nm, industrial automation POF links are used at relatively low bit rates of 1–2 Mbps although new standards exist for data rates of hundreds of Mbps over 50 m of SI-POF.

There are however two significant drawbacks of using the 650 nm transmission window of PMMA. The first drawback is that the 650 nm transmission window is not the lowest attenuation window of PMMA, in fact the lowest attenuation windows for PMMA occur at the wavelengths of 510 nm (green) and 570 nm (amber) both of which have an attenuation of approximately −90 dBm/km for high quality POF. It can be readily appreciated that operating a POF link at either of these alternative wavelengths would enable the maximum point-to-point link length to be significantly increased when compared to a link operating at 650 nm. The second drawback to using the 650 nm window is that the LEDs operating at this wavelength based on the semiconductor alloy AlGaInP are noted for their poor thermal stability whereby the output power significantly reduces with an increase in the ambient temperature. As a consequence a large fraction of the total optical budget of a link is used to accommodate the significant change in output power of the LED over the link's specified temperature range.

A prior art class of LEDs based on GaAsP and AlGaInP semiconductor technology are capable of emitting at the PMMA attenuation windows of 510 and 570 nm. However, these LEDs are not suitable for PMMA POF based data communication due to their exceedingly low efficiencies in the case of green GaAsP LEDs, and very poor thermal characteristics in regard to amber AlGaInP based LEDs.

A new class of LEDs and edge emitting lasers based on GaN/InGaN/AlGaInN semiconductor alloys has been recently demonstrated [1, 2] and such diodes are also described in U.S. Pat. No. 5,563,422 issued in October 1996 to S. Nakamura et al. This class of nitride based LED can produce efficient devices capable of operating with emission wavelengths from violet to amber. Green and amber gallium nitride based LEDs are typically used for display applications and as such are optimised for these applications. A typical prior art nitride LED includes in descending sequence a transparent top electrode, a top confining layer, a current blocking layer, an active region comprising quantum wells, a bottom confining layer, and a substrate. Electrical contact can be made to the bottom confinement layer either directly or through a conducting substrate. Optical output is through the top surface. Although some experiments have been made in demonstrating POF communication links using LEDs of this type [3] these devices are limited to a maximum modulation frequency of around 50 Mbps and have Lambertian far-field beam characteristics that lead to low coupling efficiencies into fibre and hence such devices limit the ultimate performance of the POF link.

The invention is therefore directed towards providing a light emitting diode which emits in the region of 510 to 570 nm and which:

can be modulated to over 100 Mbps, and/or
has a weak response to temperature change, and/or
has a high optical efficiency, and/or
has improved coupling efficiency to POF.

REFERENCES

1. S. Nakamura, Journal Vacuum Science & Technology, Vol. A13, p 705 (1995).
2. S. Nakamura et al, Japanese Journal Applied Physics, Part 2 Vol. 35, L74 (1996).
3. T. Matsuoka et al, Elect. Lett., Vol. 36 (22), p 1836–1837 (2000).

SUMMARY OF THE INVENTION

According to the invention, there is provided a light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength.

In one embodiment, the thickness of the output confining layer is such that its optical path length is 5% to 11% greater than half of the emitting wavelength.

In another embodiment, there are three or less quantum wells in the active region.

In a further embodiment, the active region comprises highly compressively strained quantum wells.

In one embodiment, the active region comprises $In_xGa_{(1-x)}N/GaN$ where x is greater than or equal to 0.3.

In another embodiment, the width of each quantum well is less than 3 nm.

In a further embodiment, the sum of the optical path lengths of all of the layers of the active region is less than half of the emitting wavelength.

In one embodiment, the emitting wavelength is 510 nm +/−10 nm and the thickness of the output confining layer is 115 nm +/−3%, the thickness of the active region is approximately 110 nm +/−3%, and the thickness of the upper transparent Ohmic contact is less than 10 nm +/−3%.

In another embodiment, the emitting wavelength is 570 nm +/−10 nm, the thickness of the upper confining layer is approximately 126 nm +/−3%, the active region thickness is approximately 120 nm +/−3% and the thickness of the upper transparent Ohmic contact is less than 10 nm +/−3%.

In a further embodiment, the upper confinement layer comprises a ¼ wavelength low refractive index AlGaN current spreading layer adjacent to the active region followed by a ¼ wavelength GaN layer.

In one embodiment, a distributed semiconductor Bragg mirror formed from a multiplicity of ¼ wavelength $Al_xGa_{(1-x)}N$/GaN layers (where 0.5<x<1.0) is inserted either 1 wavelength, 1½ wavelength, 2 wavelength etc from the active region on the side opposite of the output confinement layer.

In another embodiment, the Bragg mirror is undoped and the Ohmic contact is in the non-output confinement layer above the Bragg mirror.

In a further embodiment, the Bragg mirror is highly n-type doped and the Ohmic contact is made below the Bragg mirror.

In one embodiment, the emission wavelength is 510 nm +/−10 nm and a distributed Bragg mirror formed from no greater than 10 pairs of AlN/GaN ¼ wavelength pairs is inserted 118 nm +/−3% from the active region, and the active region is 115 nm +/−3% from the output-side contact.

In another embodiment, the emission wavelength is 510 nm +/−10 nm and a distributed Bragg mirror formed from no greater than 10 pairs of AlN/GaN ¼ wavelength pairs is inserted 132 nm +/−3% from the active region on the non-output side and the active region is 129 nm +/−3% below the output-side contact.

In a further embodiment, the emission wavelength is 510 nm +/−10 nm and a distributed Bragg mirror formed from no greater than 10 pairs of AlN/GaN ¼ wavelength pairs is inserted 108 nm +/−3% from the active region on the non-output side and the active region is 110 nm +/−3% below the output-side contact.

In one embodiment, the emission wavelength is 570 nm +/−10 nm and a distributed Bragg mirror formed from no greater than 10 pairs of AlN/GaN ¼ wavelength pairs is inserted 121 nm +/−3% from the active region and where the active region is 123 nm +/−3% from the contact layer on the non-output side.

In another embodiment, the output confinement layer is of p-type conductivity, and the other confinement layer is of n-type conductivity.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DESCRIPTION OF THE EMBODIMENTS

Figure 1:
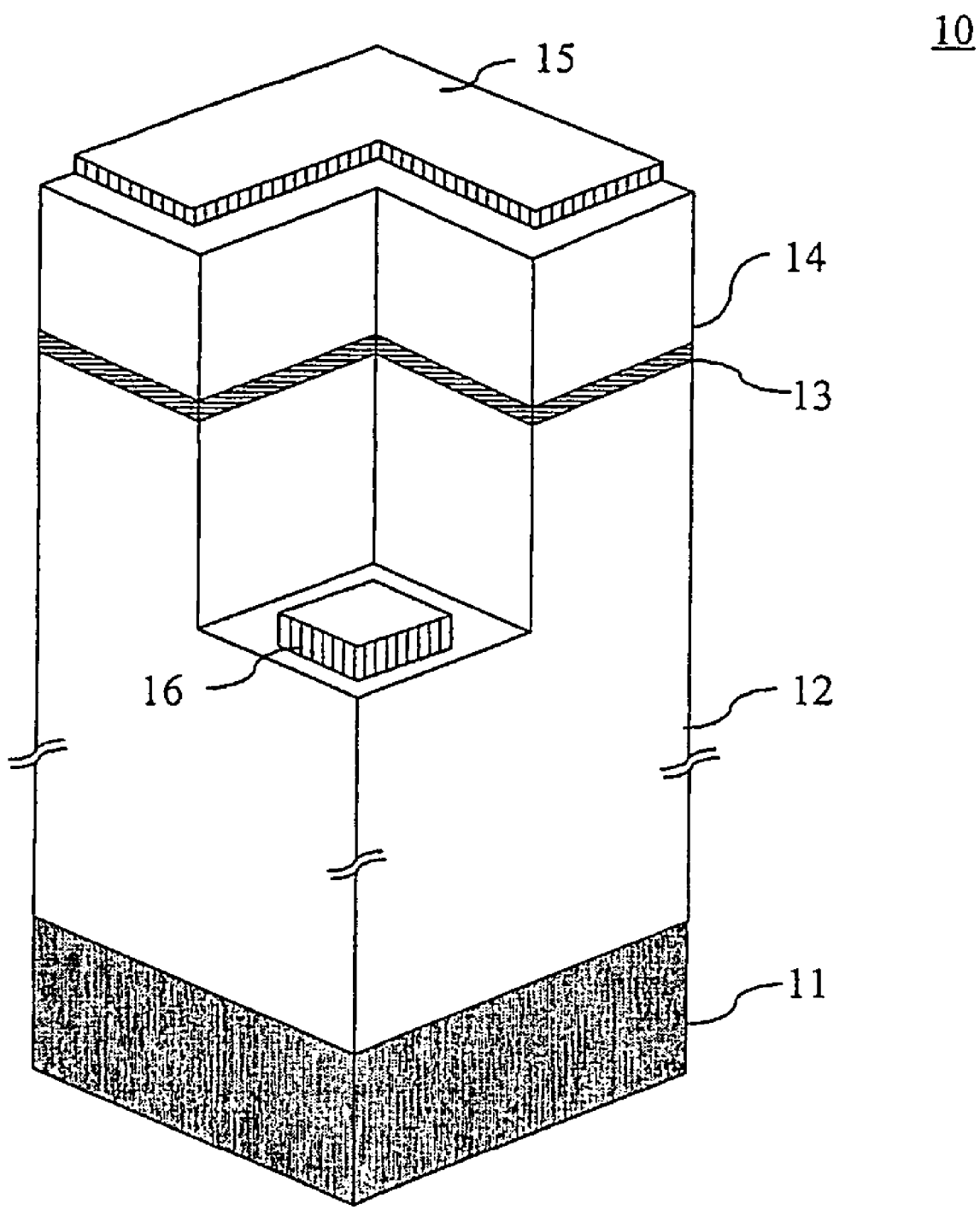
FIG. 1 is a schematic representation of a diode of the invention.

FIG. 1 is a general schematic representation of a simple embodiment of a high-speed green LED 1. The LED 1 comprises a substrate material 11, a bottom confining layer 12 of GaN heavily n-doped, an active region 13 comprising of an $In_xGa_{(1-x)}N$/GaN quantum well or wells whose spontaneous emission wavelength at room temperature is in the vicinity of either 510 or 570 nm, an upper GaN confinement layer 14 heavily p-doped, and a semi-transparent Ohmic contact layer 15. An Ohmic contact 16 is made to the layer 12 following the patterning and etching of the layers 12, 13 and 14.

The LED 1 may alternatively be operated embedded in a polymer material as is commonly the case in LED packaging processes, or free standing within an ambient atmosphere.

At the schematic level of FIG. 1, the LED 1 is generally similar to prior art nitride LEDs. However, it includes various advantageous features as set out below.

The free carrier life-time within the LED is minimised while maintaining sufficient quantum efficiency to meet the necessary fibre-coupled power requirements for the operation of the POF link. This is achieved by controlling the number and thickness of the quantum wells within the active region 13 while the extraction efficiency is optimised by taking advantage of optical interference effects and accurately positioning the active region 13 close to the uppermost surface of the LED.

The active region 13 is composed of either a single quantum well (SQW), double quantum wells (DQW) or triple quantum wells (TQW). However, in some embodiments there may be as many as eight. This is contrary to prior art practice where the active region of an LED conventionally contains in the region of 10 quantum wells. A consequence of using SQW, DQW or TQWs is that a significant reduction in the free carrier life-time can be achieved and hence an increase in the modulation bandwidth of the LED.

A further advantageous feature of the active region 13 is that it is composed of quantum wells whose well widths are less than 30 Å. This minimises the quantum well's piezoelectric field and in doing so also assists in minimising the spontaneous emission life-time of carriers within the quantum wells. This in turn maximises the maximum modulation frequency of the LED.

To improve the efficiency of the LED advantage is taken of an optical interference effect whereby the active region 13 is accurately positioned close to the uppermost surface of the LED, which due to the large change in refractive index that occurs at this surface behaves as a mirror and determines where the maximum and minimum optical field intensities occur within the LED structure. In the preferred embodiment of this invention the thickness of the confining layer 14 is such that its optical path length is slightly greater than of the emitting wavelength (½ wavelength). For example, for an emitting wavelength of 510 nm, and a refractive index (n) of 2.39, a thickness (t) of 115 nm gives an optical path length (n*t) of 274.85 nm. This is approximately 20 nm greater than half of the emitting wavelength (255 nm). Thus the optical path length is approximately 8% greater than half the emitting wavelength. In general, the difference is in the range of 5% to 11% greater.

Also, the thickness of the active region 13 comprising of the quantum wells and quantum well barriers is also kept to below a ½ wavelength to maximise the overlap of the optical standing wave with the quantum wells and thereby maximise the emission efficiency. For SQW, DQW and TQW active regions the total quantum well thickness is only a small fraction of a ½ wavelength which in the case of peak emission at 510 nm is approximately 1100 Å. This use of a small number of quantum wells also ensures that the overlap between the quantum wells and peak field of the optical field (field antinode) is maximised. This is contrary to current prior art practice.

Figure 2:
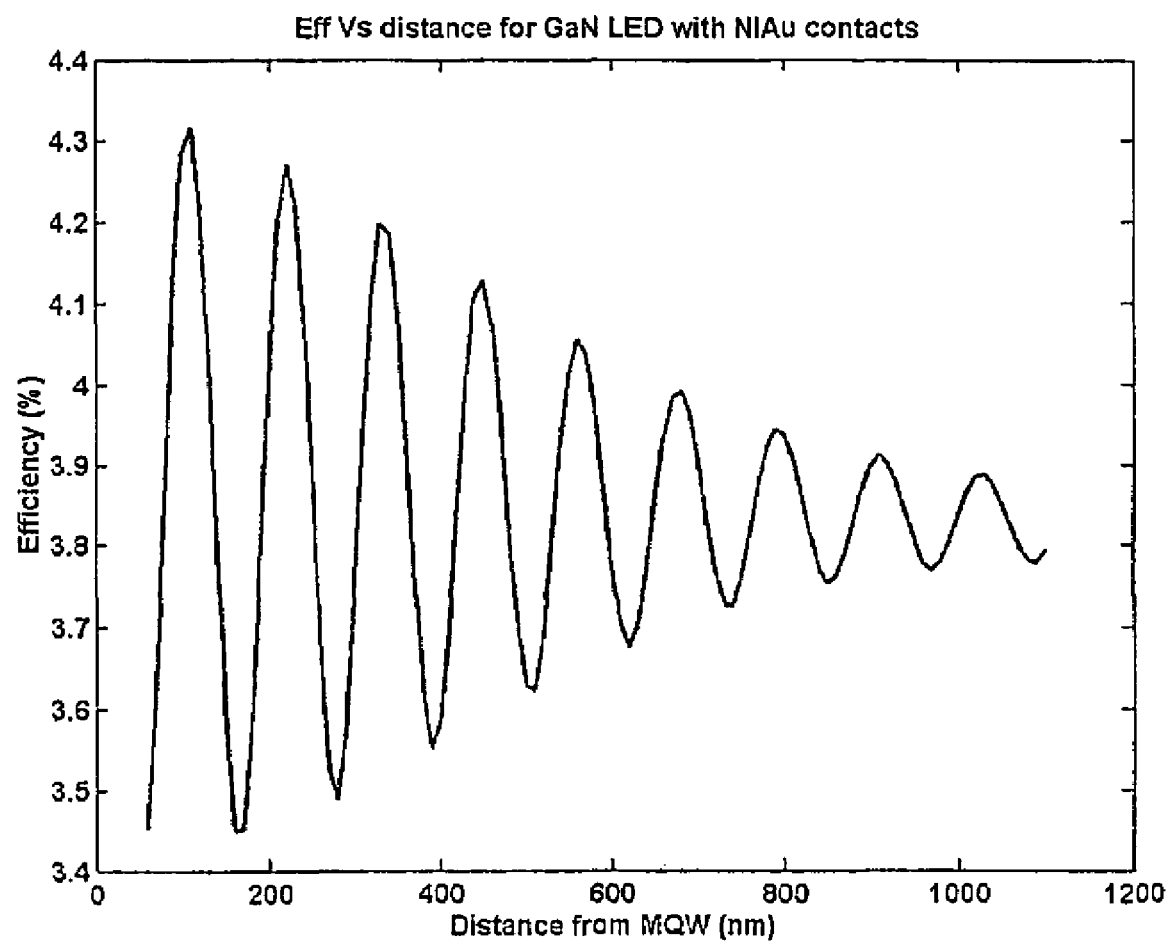
FIG. 2 is a plot of extraction efficiency through the uppermost surface versus distance of the active region from the uppermost surface.

In particular, the inventors calculate as shown in FIG. 2 that a maximum extraction efficiency into air (that is the fraction of photons generated in the active region that exit the device through the top surface only) of 4.4% can be achieved when the thickness of the p-type GaN confinement layer 14 is 1150 Å as compared to 3.8% when the active region 13 is positioned a large arbitrary distance from the uppermost interface as is the case in prior art LEDs. The maximum extraction efficiency achieved is also dependent upon the thickness of the semi-transparent Ohmic contact layer 15. A particular example of a semi-transparent contact although not unique is an oxidised NiAu contact and if employed it is desirable that the thickness of layer 15 be less than 100 Å.

The spontaneous life-time and internal quantum efficiency are also dependent upon the orientation of the dipole with respect to the mirror formed by the uppermost surface of layer 14. It is preferential that the dipoles that exist in the quantum wells lie parallel to the mirror surface. The ratio of parallel to perpendicular dipoles is determined by the details of the quantum well's band structure. To promote an increased ratio of parallel dipoles the diodes of the invention use highly compressively strained $In_xGa_{(1-x)}N/GaN$ quantum wells where x=0.3 or greater.

Figure 3:
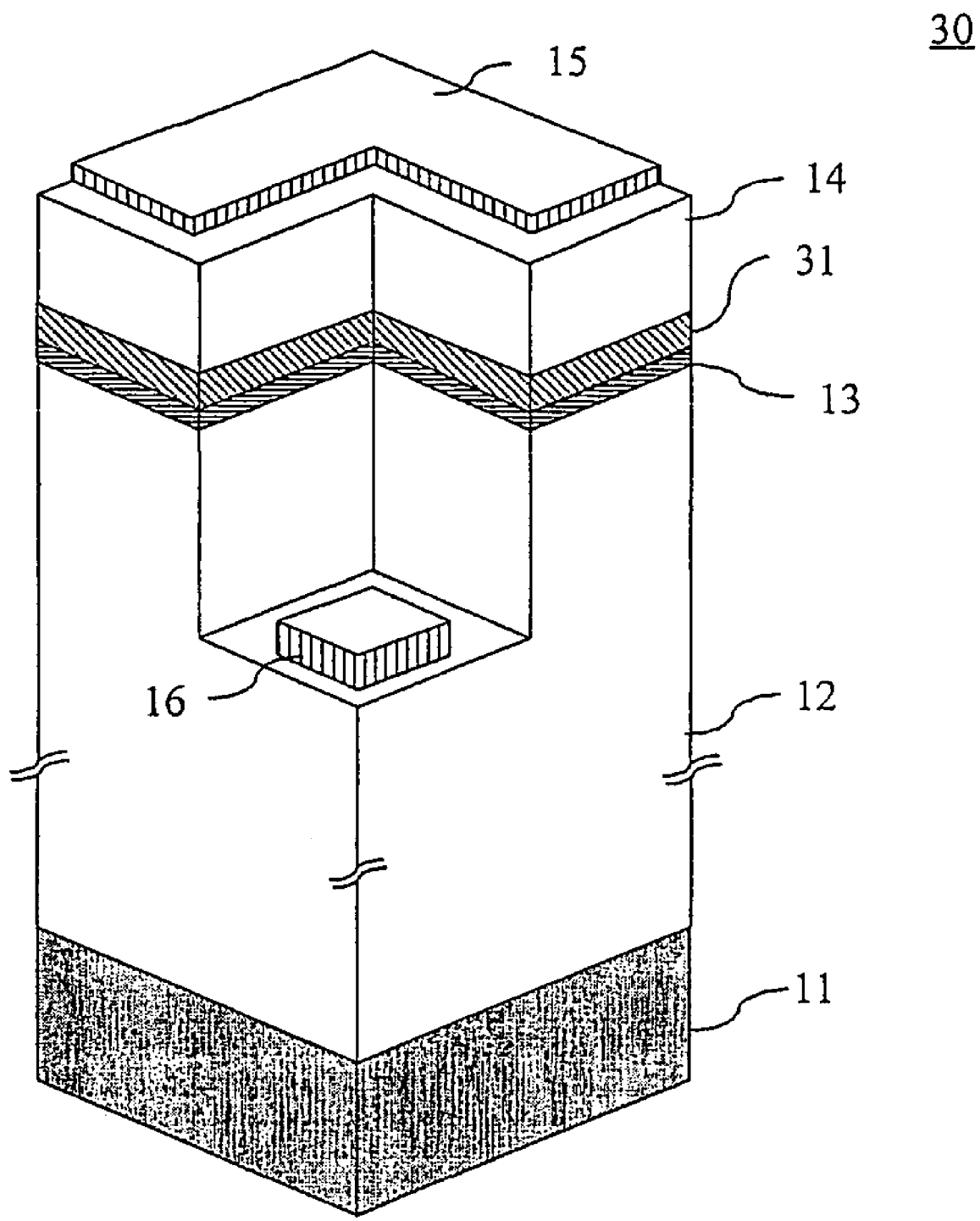
FIGS. 3 to 5 are schematic representations of alternative diodes of the invention.

Referring to FIG. 3, a diode 30 comprises the components of the diode 1, plus a $Al_xGa_{(1-x)}N$ current spreading layer 31 immediately above the active region. The layer 31 has a lower refractive index than the GaN of layer 14. Maximum extraction efficiency is maintained by the optical thickness of layers 31 and 14 being approximately a ¼ wavelength each thus maintaining a total combined optical thickness of a ½ wavelength.

Figure 4:
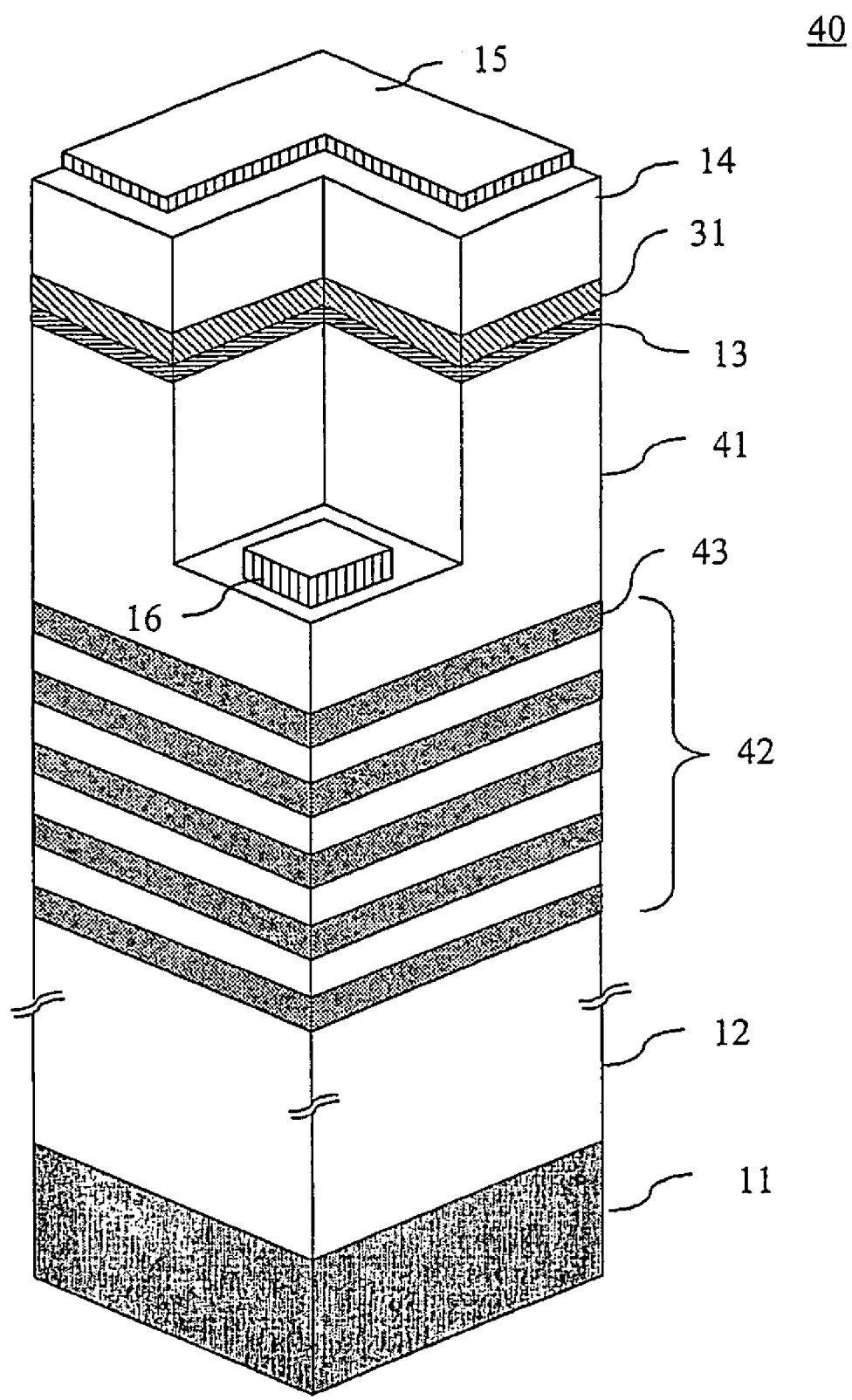

FIG. 4 shows a schematic representation of a further diode 40 of the invention. In this embodiment a distributed semiconductor Bragg reflector (DBR) mirror 42 formed from a multiplicity of ¼ wavelength $Al_xGa_{(1-x)}N/GaN$ layers (where 0.5<x<1.0) is positioned below the quantum wells thereby forming a weak Fabry-Perot micro-optical cavity. In this instance the bottom mirror is formed by the semiconductor DBR (42) while the top mirror is formed by the uppermost semiconductor interface between layers 14 and 15. In general the extraction efficiency can be optimised by placing the QWs at a cavity anti-node and by restricting the size of the cavity to the first few allowable modes i.e. a 1-, 2- or 3-λ cavity.

Figure 5:
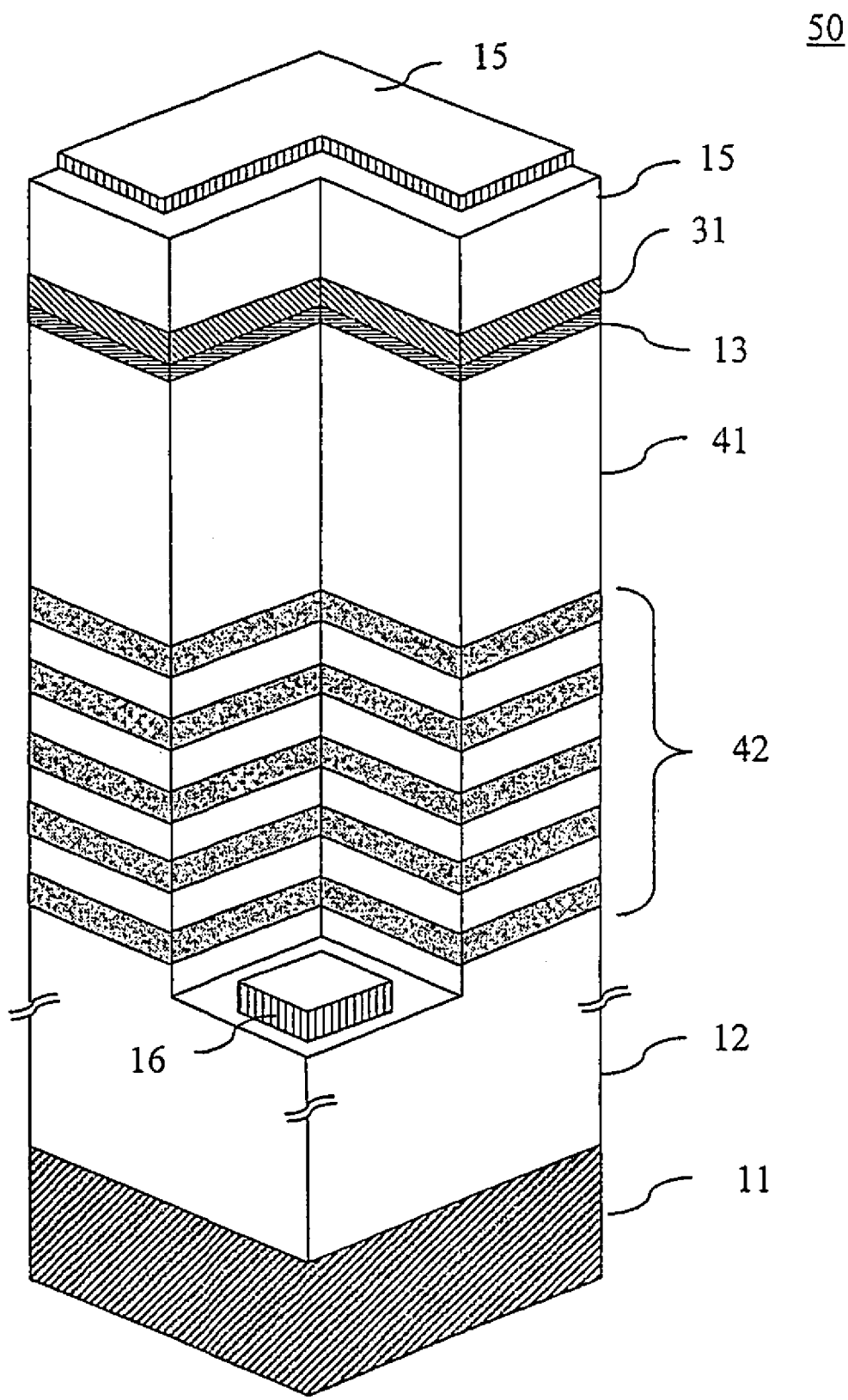

The Bragg reflector shown in FIG. 4 is undoped and therefore the p-type Ohmic contact 16 must be located within the optical cavity in layer 41. The embodiment shown in FIG. 5 shows a schematic representation of the LED when the Bragg reflector 42 is heavily doped and hence the Ohmic contact 16 is made below the Bragg reflector in layer 12.

To optimise the extraction into air (i.e. a numerical aperture of 1) the cavity needs to be detuned with respect to the emission wavelength of the QWs i.e. the cavity wavelength needs to be made slightly longer than QW wavelength. The extraction into POF (i.e. a numerical aperture of 0.5) requires the cavity and quantum wells to approach the resonant condition. Thus for either 510 nm or 570 m (+/−10 nm) there will be two distinct cavity designs—one for coupling into air and the other designed for coupling into POF. Other factors which determine the extraction efficiency are the aluminium fraction in the ¼ wavelength $Al_xGa_{(1-x)}N/GaN$ layers of the DBR and the number of mirror pairs. The aluminium composition of the mirrors can be varied within the range 0.5<x<1.0 but best results are achieved with the highest index of refraction contrast i.e. when the mirror pairs are formed by quarter wave layers of AlN/GaN. Maximising the number of mirror pairs also increases the extraction efficiency but there is little to be gained by using more than 10 pairs. The results are summarised in the table below for a device with a 10 pair DBR.

| Wavelength (nm) (+/−10 nm) | Coupling into air (NA = 1.0) | | Coupling into POF (NA = 0.5) | |
| --- | --- | --- | --- | --- |
| | Upper confining layer (nm, +/−3%) | Lower confining layer (nm, +/−3%) | Upper confining layer (nm, +/−3%) | Lower confining layer (nm, +/−3%) |
| 510 | 115 | 118 | 108 | 110 |
| 570 | 129 | 132 | 121 | 123 |

The gain in the extraction efficiency when emitting into air is a factor of 4 higher than compared with the bare LED, and a factor of 5 higher when optimised for coupling to POF.

The invention is not limited to the embodiments described but may be varied in construction and detail. For example, the confinement layer through which the light is extracted may be beneath the active region, the geometry being reversed. Also, the polarities of the semiconductor doping may be reversed.

The invention claimed is:

1. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength, wherein the sum of the optical path lengths of all of the layers of the active region is less than half of the emitting wavelength, and wherein the emitting wavelength is 570 nm +/−10 nm, the thickness of the upper confining layer is approximately 126 nm +/−3%, the active region thickness is approximately 120 nm +/−3% and the thickness of the upper transparent Ohmic contact is less than 10 nm +/−3%.

2. The light emitting diode as claimed in claim 1, wherein the thickness of the output confining layer is such that its optical path length is 5% to 11% greater than half of the emitting wavelength.

3. The light emitting diode as claimed in claim 1, wherein there are three or less quantum wells in the active region.

4. The light emitting diode as claimed in claim 1, wherein the active region comprises highly compressively strained quantum wells.

5. The light emitting diode as claimed in claim 1, wherein the active region comprises $In_xGa_{(1-x)}N/GaN$ where x is greater than or equal to 0.3.

6. The light emitting diode as claimed in claim 1, wherein the width of each quantum well is less than 3 nm.

7. The light emitting diode as claimed in claim 1, wherein the upper confinement layer comprises a ¼ wavelength low refractive index AlGaN current spreading layer adjacent to the active region followed by a ¼ wavelength GaN layer.

8. The light emitting diode as claimed in claim 1, wherein a distributed semiconductor Bragg mirror formed from a multiplicity of ¼ wavelength $Al_xGa_{(1-x)}N/GaN$ layers (where 0.5<x<1.0) is inserted either 1 wavelength, 1½ wavelength, 2 wavelength etc from the active region on the side opposite the output confinement layer.

9. The light emitting diode as claimed in claim 8, wherein the Bragg mirror is undoped and the Ohmic contact is in the non-output confinement layer above the Bragg mirror.

10. The light emitting diode as claimed in claim 8, wherein the Bragg mirror is highly n-type doped and the Ohmic contact is made below the Bragg mirror.

11. The light emitting diode as claimed in claim 8, wherein the emission wavelength is 510 nm +/−10 nm and a distributed Bragg mirror formed from no greater than 10 pairs of AlN/GaN ¼ wavelength pairs is inserted 118 nm +/−3% from the active region, and the active region is 115 nm +/−3% from the output-side contact.

12. The light emitting diode as claimed in claim 8, wherein the emission wavelength is 510 nm +/−10 nm and a distributed Bragg mirror formed from no greater than 10 pairs of AlN/GaN ¼ wavelength pairs is inserted 132 nm +/−3% from the active region on the non-output side and the active region is 129 nm +/−3% below the output-side contact.

13. The light emitting diode as claimed in claim 8, wherein the emission wavelength is 510 nm +/−10 nm and a distributed Bragg mirror formed from no greater than 10 pairs of AlN/GaN ¼ wavelength pairs is inserted 108 nm +/−3% from the active region on the non-output side and the active region is 110 nm +/−3% below the output-side contact.

14. The light emitting diode as claimed in claim 8, wherein the emission wavelength is 570 nm +/−10 nm and a distributed Bragg mirror formed from no greater than 10 pairs of AlN/GaN ¼ wavelength pairs is inserted 121 nm +/−3% from the active region on the non-output side and where the active region is 123 nm +/−3% from the contact layer on the output side.

15. The light emitting diode as claimed in claim 1, wherein the output confinement layer is of p-type conductivity, and the other confinement layer is of n-type conductivity.

16. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength; wherein a distributed semiconductor Bragg mirror formed from a multiplicity of ¼ wavelength $Al_xGa_{(1-x)}N/GaN$ layers (where $0.5<x<1.0$) is inserted either 1 wavelength, 1½ wavelength, 2 wavelength etc from the active region on the side opposite the output confinement layer; and wherein the Bragg mirror is highly n-type doped and the Ohmic contact is made below the Bragg mirror.

17. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength; wherein a distributed semiconductor Bragg mirror formed from a multiplicity of ¼ wavelength $Al_xGa_{(1-x)}N/GaN$ layers (where $0.5<x<1.0$) is inserted either 1 wavelength, 1½ wavelength, 2 wavelength etc from the active region on the side opposite the output confinement layer; and wherein the emission wavelength is 510 nm +/−10 nm and a distributed Bragg mirror formed from no greater than 10 pairs of AlN/GaN ¼ wavelength pairs is inserted 118 nm +/−3% from the active region, and the active region is 115 nm +/−3% from the output-side contact.

18. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength; wherein a distributed semiconductor Bragg mirror formed from a multiplicity of ¼ wavelength $Al_xGa_{(1-x)}N/GaN$ layers (where $0.5<x<1.0$) is inserted either 1 wavelength, 1½ wavelength, 2 wavelength etc from the active region on the side opposite the output confinement layer; and wherein the emission wavelength is 510 nm +/−10 nm and a distributed Bragg mirror formed from no greater than 10 pairs of AlN/GaN ¼ wavelength pairs is inserted 132 nm +/−3% from the active region on the non-output side and the active region is 129 nm +/−3% below the output-side contact.

19. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength; wherein a distributed semiconductor Bragg mirror formed from a multiplicity of ¼ wavelength $Al_xGa_{(1-x)}N/GaN$ layers (where $0.5<x<1.0$) is inserted either 1 wavelength, 1½ wavelength, 2 wavelength etc from the active region on the side opposite the output confinement layer; and wherein the emission wavelength is 510 nm +/−10 nm and a distributed Bragg mirror formed from no greater than 10 pairs of AlN/GaN ¼ wavelength pairs is inserted 108 nm +/−3% from the active region on the non-output side and the active region is 110 nm +/−3% below the output-side contact.

20. A light emitting diode of the gallium nitride type comprising a substrate, an active region, a confining layer on each side of the active region including an output confining layer being the one through which light is extracted, and Ohmic contacts, wherein the thickness of the output confining layer is such that its optical path length is equal to or greater than half of the emitting wavelength; wherein a distributed semiconductor Bragg mirror formed from a multiplicity of ¼ wavelength $Al_xGa_{(1-x)}N/GaN$ layers (where $0.5<x<1.0$) is inserted either 1 wavelength, 1½ wavelength, 2 wavelength etc from the active region on the side opposite the output confinement layer; and wherein the emission wavelength is 570 nm +/−10 nm and a distributed Bragg mirror formed from no greater than 10 pairs of AlN/GaN ¼ wavelength pairs is inserted 121 nm +/−3% from the active region on the non-output side and where the active region is 123 nm +/−3% from the contact layer on the output side.

* * * * *